United States Patent
Haimson et al.

(10) Patent No.: US 9,159,662 B2
(45) Date of Patent: Oct. 13, 2015

(54) SEMICONDUCTOR STRUCTURES HAVING ADHESION PROMOTING LAYER IN CAVITIES

(71) Applicant: Micron Technology, Inc., Boise, ID (US)

(72) Inventors: Shai Haimson, Qiryat-Gat (IL); Avi Rozenblat, Qiryat-Gat (IL); Dror Horvitz, Qiryat-Gat (IL); Maor Rotlain, Qiryat-Gat (IL); Rotem Drori, Qiryat-Gat (IL)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/309,516

(22) Filed: Jun. 19, 2014

(65) Prior Publication Data

US 2014/0299992 A1 Oct. 9, 2014

Related U.S. Application Data

(62) Division of application No. 12/948,897, filed on Nov. 18, 2010, now Pat. No. 8,772,155.

(51) Int. Cl.
| | |
|---|---|
| H01L 23/48 | (2006.01) |
| H01L 23/52 | (2006.01) |
| H01L 29/40 | (2006.01) |
| H01L 23/498 | (2006.01) |
| H01L 21/768 | (2006.01) |
| H01L 23/485 | (2006.01) |
| H01L 21/44 | (2006.01) |

(52) U.S. Cl.
CPC .... *H01L 23/49827* (2013.01); *H01L 21/76846* (2013.01); *H01L 21/76865* (2013.01); *H01L 21/76877* (2013.01); *H01L 23/485* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,961,822 A | 10/1990 | Liao et al. | |
| 6,130,161 A | 10/2000 | Ashley et al. | |
| 6,333,547 B1 * | 12/2001 | Tanaka et al. | 257/649 |
| 6,888,251 B2 | 5/2005 | Cooney et al. | |
| 6,897,143 B2 | 5/2005 | Toyoda et al. | |
| 7,615,489 B1 | 11/2009 | Fu | |
| 7,670,946 B2 * | 3/2010 | Siew et al. | 438/637 |
| 2003/0186537 A1 | 10/2003 | Yamanaka et al. | |
| 2006/0148239 A1 | 7/2006 | Han | |
| 2007/0007653 A1 | 1/2007 | Chen et al. | |
| 2008/0061333 A1 * | 3/2008 | Hidaka | 257/295 |
| 2009/0020883 A1 * | 1/2009 | Nomura et al. | 257/774 |
| 2009/0189218 A1 | 7/2009 | Pan | |

* cited by examiner

*Primary Examiner* — Michael Jung
(74) *Attorney, Agent, or Firm* — Dorsey & Whitney LLP

(57) ABSTRACT

High aspect ratio trenches may be filled with metal that grows more from the bottom than the top of the trench. As a result, the tendency to form seams or to close of the trench at the top during filling may be reduced in some embodiments. Material that encourages the growth of metal may be formed in the trench at the bottom, while leaving the region of the trench near the top free of such material to encourage growth upwardly from the bottom.

16 Claims, 4 Drawing Sheets

SEMICONDUCTOR STRUCTURES HAVING ADHESION PROMOTING LAYER IN CAVITIES

CROSS-REFERENCE TO RELATED APPLICATION

This application is a divisional to U.S. patent application Ser. No. 12/948,897, filed Nov. 18, 2010, issued as U.S. Pat. No. 8,772,155 on Jul. 8, 2014. This application and patent are incorporated herein by reference in their entirety and for any purpose.

BACKGROUND

This relates to semiconductor processing and, particularly, to techniques for filling cavities.

A high aspect ratio cavity is a cavity, hole, depression, or trench whose depth is twice its width or more. Because of the high aspect ratio, cavity filling tends to be problematic. For example, in the course of filling such cavities, seam formation may result. A seam is basically an opening or crack within the filled material. The seam is then prone to subsequent etching in ensuing processing. Another possibility is the formation of overhangs near the top of the trench which close off the trench and prevent complete filling of the trench.

DETAILED DESCRIPTION

Figure 1:
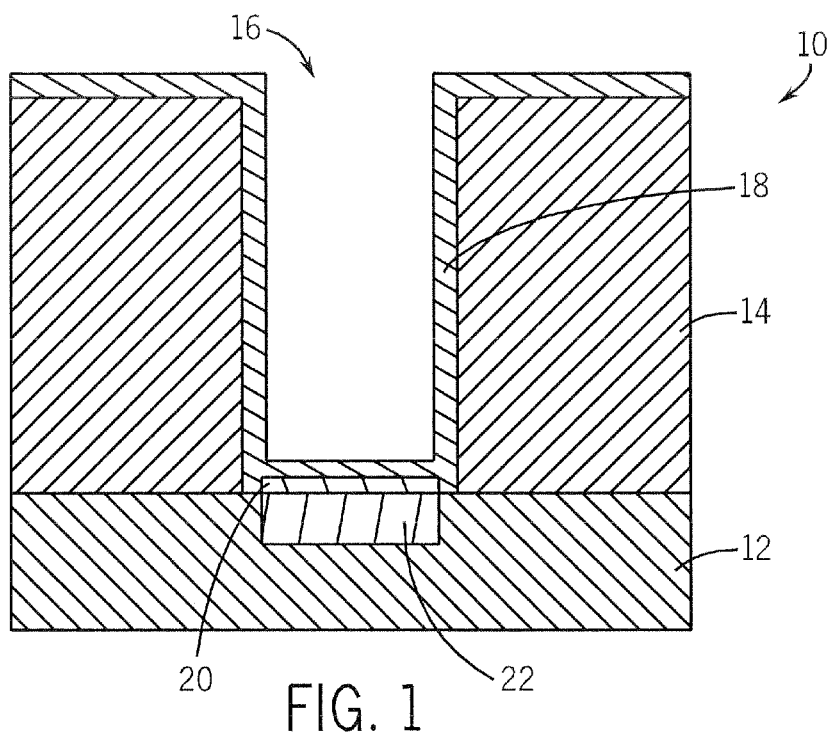
FIG. 1 is an enlarged, cross-sectional view of one embodiment at an early stage of manufacture.

Referring to FIG. 1, a high aspect ratio cavity 16 may be defined in a semiconductor structure 10 including a dielectric material 14, such as a silicon dioxide dielectric material. The cavity may be formed in a dielectric material made up of a number of different layers in some embodiments. In one embodiment, the dielectric material 14 is over a semiconductor substrate 12, such as a silicon substrate.

In one conventional application, the substrate 12 may have a silicide 22 formed therein. The silicide may be covered by a metal layer 20. For example, the metal layer 20 may be titanium and the silicide 22 may be titanium silicide.

The metal layer 20 may be covered by a liner or layer 18 which partially lines the vertical extent of the cavity 16, covers the metal layer 20, and extends all the way down past the metal layer 20 to the substrate 12 in one embodiment.

Generally, the layer 18 is a thin, conformal layer or layers which lines the bottom and sidewall of the cavity 16. It may be grown, deposited, or formed using any technique. In one embodiment, the layer 18 may be titanium nitride.

In some embodiments, the layer 18 is an adhesion promoting layer. As used herein, an "adhesion promoting layer" is a layer between two other layers that increases the adhesion between the two other layers.

Figure 2:
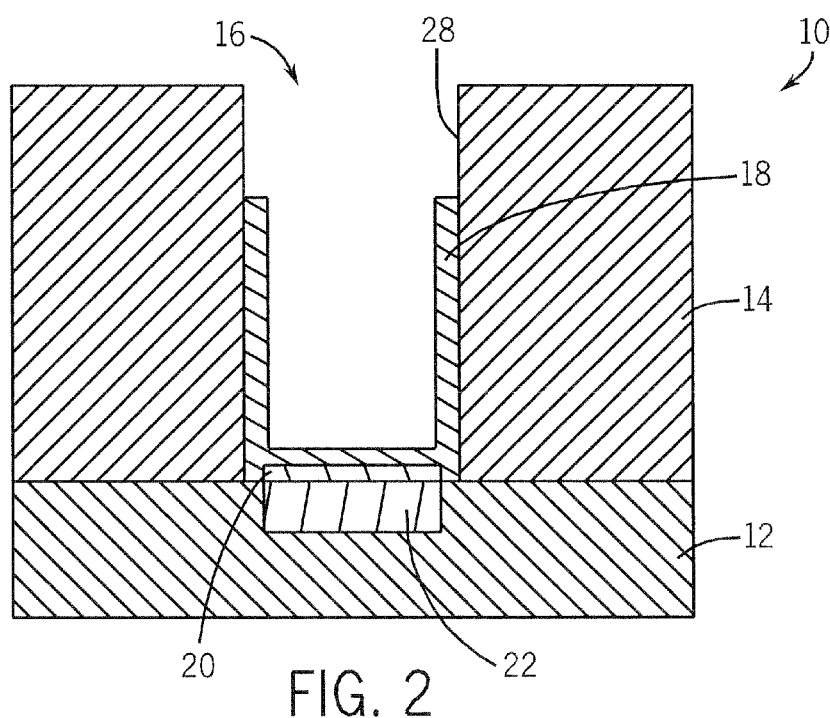
FIG. 2 is an enlarged, cross-sectional view subsequent thereto in accordance with one embodiment.

The cavity 16 may then be cleaned by a pattern dependent etch, a polish or by any technique that removes the upper horizontal portion of the layer 18 and an upper vertical portion of the layer 18 to expose only the upper sidewall portion 28, as shown in FIG. 2. A "pattern dependent etch" is an etch whose etch rate depends on the pattern spacing. Thus, a pattern dependent etch tends to clear the upper sidewall portion 28 because it is more closely spaced than other features exposed directly to the etch. The pattern dependent etch or polish may be tuned to clean more or less of the depth of the cavity by adjusting etch or polish parameters, including processing time, chemistry, and energy.

The etch or polish exposes surfaces of different composition, inside the cavity 16, including the exposed sidewall portion 28, which may be dielectric, for example, and bottom or lower surface of the cavity formed of the layer 18, which may be a metal nitride, for example. These various exposed surfaces may be selected to have different deposition rates for a given deposited material. In such case, the deposited material may be "selectively" deposited on one exposed material because it builds up preferentially on that material. Thus, a material, blanket deposited over the structure, may build up preferentially or even exclusively on one exposed surface, because of the chemical composition of that surface, relative to others of the exposed surfaces.

Figure 3:
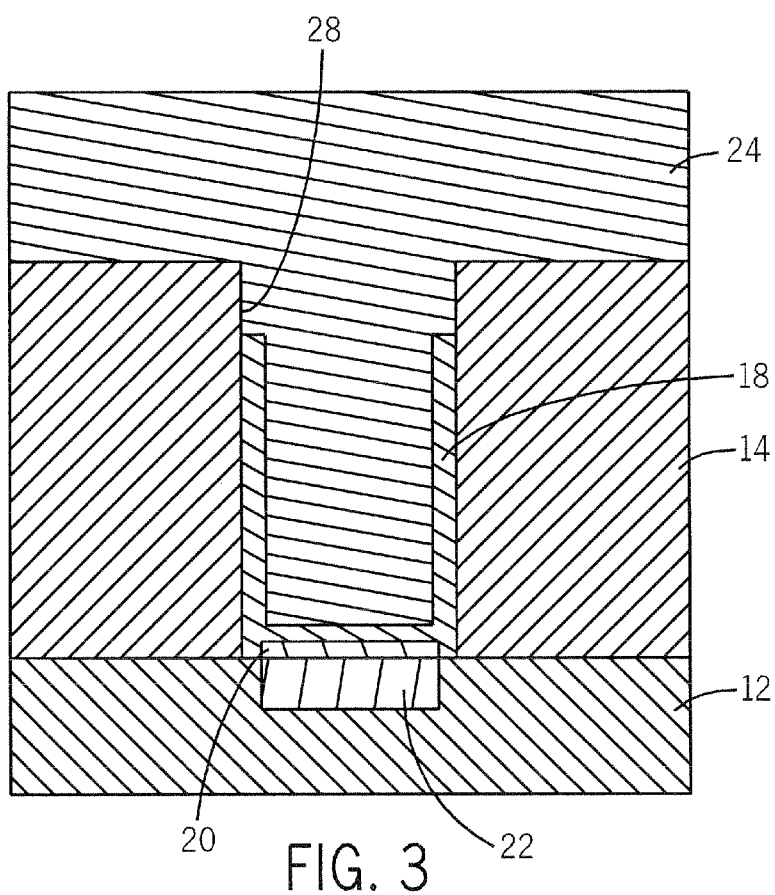
FIG. 3 is an enlarged, cross-sectional view subsequent thereto in accordance with one embodiment.

Thereafter, the exposed surfaces of the cavity may be subjected to chemical vapor deposition, resulting in different growth kinetics on different surfaces, and allowing control over the deposition location, fill direction, and growth rate inside the cavity, as shown in FIG. 3. Generally, in some embodiments, it is desirable to cause deposition to occur from growth that extends upwardly from the bottom of the cavity. The bottom up deposition may reduce the tendency to form overhangs and/or seams in the deposits that are undesirable.

In some embodiments, the layer 18 may be an adhesion promoting layer to adhere the layer 24. Thus, while layer 18 may be titanium nitride, the layer 24 may be tungsten in one embodiment. In one embodiment, the layer 18 increases the adhesion between a silicon dioxide dielectric 14 and the layer 24.

For example, in one embodiment, an adhesion promoting layer 18 may be deposited in the cavity 16 at the stage shown in FIG. 2, using physical vapor deposition or chemical vapor deposition, to mention two examples. This may be followed by a pattern dependent etch or polish that removes the adhesion promoting layer from the sidewall portion 28, while leaving the adhesion promoting layer at the bottom of the cavity.

Then, when a metal or other layer 24 is selectively deposited, for example by chemical vapor deposition, and directional growth occurs from the bottom of the cavity upwardly, as shown in FIG. 3. This upward growth is due at least in part to the fact that there is no adhesion promoting layer 18 on the sidewall portion 28 and, therefore, the deposited layer 24 does not adhere to the sidewall portion 28, in one embodiment, to the extent that it adheres to the layer 18. This selective deposition may result in bottom up deposition in some embodiments.

Figure 4:
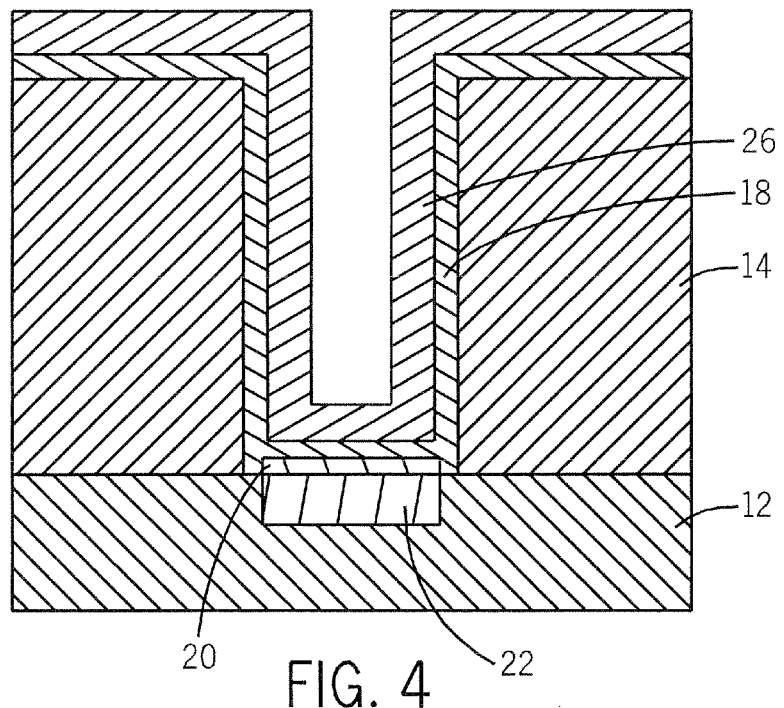
FIG. 4 is an enlarged, cross-sectional view in accordance with another embodiment.

As another example, the adhesion promoting layer 18 may be deposited as described above, followed by the deposition of a thin metal nucleation layer. For example, the metal nucleation layer may be a pulsed nucleation layer in one embodiment. Thus, as an example, the pulsed nucleation layer 26, shown in FIG. 4, may be a tungsten nucleation layer.

Figure 5:
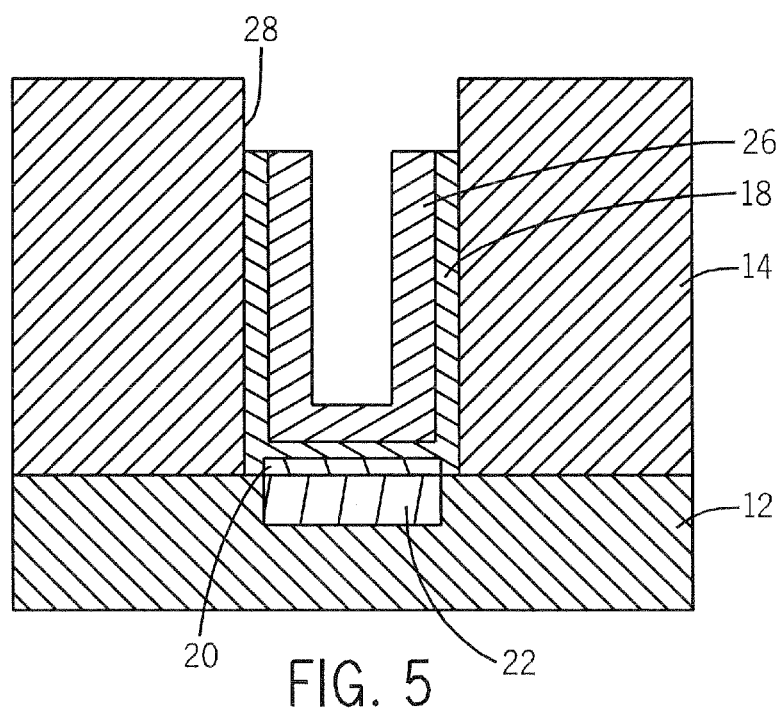
FIG. 5 is an enlarged, cross-sectional view subsequent thereto in accordance with the embodiment of FIG. 4.

Following the deposition of the thin nucleation layer 26, a pattern dependent etch or polish may be used to remove the nucleation and adhesion promoting, layers 26 and 18 from the upper sidewall portion 28, while leaving nucleation and adhesion promoting layers on the bottom of the cavity, as shown in FIG. 5. Thereafter, the same metal as used for the nucleation layer may be deposited or grown using selective deposition and directional growth from the bottom of the cavity. Again, this upward growth results where the nucleation layer and the adhesion promoting layer are present, which encourages growth of the deposited material, such as tungsten.

Figure 6:
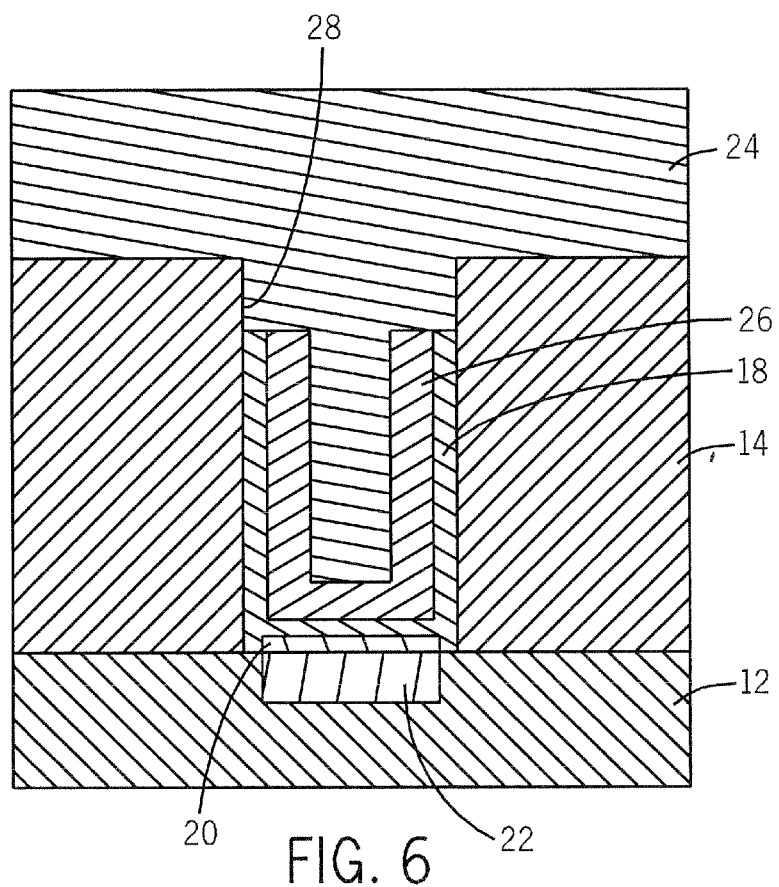
FIG. 6 is an enlarged, cross-sectional view subsequent thereto in accordance with one embodiment.

Thus, as shown in FIG. 6, a layer 24, such as metal, is deposited starting from the bottom of the cavity 16 and moving upwardly because of the presence of the layer 26 at the bottom of the cavity, but not at its upper extent. As a result, the metal does not begin to grow near the top of the cavity, but, preferentially, grows from the bottom. Because the upper sidewall portion 28 of the cavity is cleared or exposed, metal growth does not occur preferentially in this area, but, rather, fills up via selective deposition from the bottom, as opposed to filling from the top or from the sides of the top of the cavity. Filling from the top may have the tendency to close off the cavity, resulting in undesirable void formation.

In some embodiments, cavity filling may be improved without the need to widen the open upper end of the cavity. This may be important in many densely populated technologies, such as semiconductor memory and logic circuitry.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed:

1. A semiconductor structure comprising:
a substrate;
a dielectric layer over the substrate;
a cavity formed in the dielectric layer, the cavity having a bottom portion and an upper sidewall portion;
a conformal lining in the cavity, the conformal lining covering the bottom portion of the cavity while leaving the upper sidewall portion of the cavity uncovered by the conformal lining, wherein the conformal lining includes a metal;
a conformal nucleation layer over the conformal lining that leaves the upper sidewall portion of the cavity uncovered by the conformal nucleation layer, wherein the conformal nucleation layer includes a metal; and
a cavity filling material having a top surface that extends over and across the cavity,
wherein the cavity filling material is a single layer that directly contacts the upper sidewall portion and the conformal nucleation layer.

2. The structure of claim 1 wherein the cavity filling material is a metal and the conformal lining is a metal nitride.

3. The structure of claim 1 wherein the conformal lining is an adhesion promoting layer which promotes adhesion of the cavity filling material.

4. The structure of claim 1 including a selectively deposited filler material in the cavity, the selectively deposited filler material selectively deposited in the bottom portion of the cavity.

5. The structure of claim 4, the conformal lining being a material which increases the adherence of the selectively filler material to the dielectric layer.

6. The structure of claim 1, including a silicide layer on the substrate, a metal layer over the silicide layer, the metal layer under the conformal lining in the bottom portion of the cavity.

7. An apparatus comprising:
a substrate;
a silicide portion in the substrate;
a metal layer over the silicide portion;
a dielectric layer over the substrate;
a cavity in the dielectric layer, the cavity including a bottom surface, wherein the bottom surface includes the metal layer and a sidewall portion, wherein the sidewall portion includes an upper portion and a bottom portion;
a liner over the bottom surface of the cavity including the metal layer and the bottom portion of the sidewall portion, wherein the liner includes a metal;
a conformal metal nucleation layer over the liner,
wherein the liner and the conformal metal nucleation layer leave the upper portion of the sidewall portion uncovered; and
a filling material having a top surface that extends over and across the cavity,
wherein the filling material is a single layer that directly contacts the upper portion and the conformal metal nucleation layer.

8. The apparatus of claim 7, wherein the bottom surface of the cavity further includes a portion of the substrate surrounding the metal layer.

9. The apparatus of claim 7, wherein the conformal metal nucleation layer is tungsten.

10. The apparatus of claim 7, wherein the conformal metal nucleation layer and the filling material are the same material.

11. The apparatus of claim 7, wherein the filling material is also over the dielectric surrounding the cavity.

12. The apparatus of claim 7, wherein the conformal metal nucleation layer and the liner are polished.

13. The apparatus of claim 7, wherein the liner is titanium nitride.

14. The apparatus of claim 7, wherein the dielectric layer is silicon dioxide.

15. The apparatus of claim 7, wherein the liner is configured to increase adhesion between the dielectric and the filling material.

16. The apparatus of claim 15, wherein the filling material is over the liner and the upper portion of the sidewall portion.

* * * * *

UNITED STATES PATENT AND TRADEMARK OFFICE
CERTIFICATE OF CORRECTION

PATENT NO. : 9,159,662 B2
APPLICATION NO. : 14/309516
DATED : October 13, 2015
INVENTOR(S) : Shai Haimson et al.

Page 1 of 1

It is certified that error appears in the above-identified patent and that said Letters Patent is hereby corrected as shown below:

| In The Claims | Reads | Should Read |
|---|---|---|
| Column 4, Lines 14-15 | The structure of claim 4, the conformal lining being a material which increases the adherence of the selectively filler material to the dielectric layer. | The structure of claim 4, the conformal lining being a material which increases the adherence of the selectively deposited filler material to the dielectric layer. |
| Column 4, Line 19 | An apparatus comprising: | An apparatus, comprising: |
| Column 4, Line 29 | a liner over the bottom surface of the cavity including the metal layer and the bottom portion of the sidewall portion, wherein the liner includes a metal; | a liner over the bottom surface of the cavity including the metal layer, and the bottom portion of the sidewall portion, wherein the liner includes a metal; |

Signed and Sealed this
Twenty-sixth Day of April, 2016

Michelle K. Lee
*Director of the United States Patent and Trademark Office*